Feb. 23, 1971 R. M. ESPOSITO ET AL 3,566,306

GUNN OSCILLATOR WITH P-N JUNCTION CONTACT FOR
FAST LOW POWER ON-OFF CONTROL
Filed June 30, 1969

INVENTORS
RALPH M. ESPOSITO
PETER S. HAUGE
CONRAD LANZA

BY John E. Dougherty Jr.

ATTORNEY

United States Patent Office 3,566,306

Patented Feb. 23, 1971

3,566,306

GUNN OSCILLATOR WITH P-N JUNCTION CONTACT FOR FAST LOW POWER ON-OFF CONTROL

Ralph M. Esposito, Somers, Peter S. Hauge, Yorktown Heights, and Conrad Lanza, Putnam Valley, N.Y., assignors to International Business Machines Corporation, Armonk, N.Y., a corporation of New York

Filed June 30, 1969, Ser. No. 837,833
Int. Cl. H03b *7/00*
U.S. Cl. 331—107 13 Claims

ABSTRACT OF THE DISCLOSURE

The controllable oscillator includes a conventional Gunn oscillator formed of a body of n type gallium arsenide with ormic contacts at both ends. The $n_0l$ product for the body is at least twice the critical value for sustaining domain nucleation and propagation. An above-threshold voltage is applied to the body to produce high frequency oscillations. The oscillations are controlled by signals applied to a p type contact made to the body at a distance $d$ from the anode such that $n_0d$ is less than the critical value for oscillations. Application of a reverse bias signal to this region causes the oscillations to stop and a stable field condition to be produced with a high field near the anode.

BACKGROUND OF THE INVENTION

Field of the invention

This invention relates to high frequency oscillator circuits and more particularly to Gunn oscillator circuits which include control means which are responsive to control signals to modulate and/or interrupt the oscillations.

Description of the prior art

It is well known in the art that the frequency of oscillations in high frequency Gunn oscillators can be modulated. It is also known that the $n_0l$ product for the semiconductor body in the oscillator must be above a critical value to obtain inherent bulk oscillations. It is also known that field distribution and oscillations in such a device can be controlled using light inputs, physical notches, regions of higher resistivity, and reverse biased p-n junctions. Illustrative of the prior art are the following:

(a) Article by McCumber and Chynoweth which appeared in IEEE Transactions on Electron Devices, vol. Ed 13, pp. 4–21, January, 1966;
(b) Pat. No. 3,435,307, issued to R. W. Landauer on Mar. 25, 1969, and commonly assigned; and
(c) Copending application Ser. No. 745,008, filed July 15, 1968, in behalf of J. B. Gunn and commonly assigned.

SUMMARY OF THE PRESENT INVENTION

In accordance with the principles of the present invention a Gunn oscillator circuit is provided in which the oscillations can be controlled by a fast, low power control circuit. Specifically, a conventional Gunn oscillator having an $n_0l$ product ($n_0$=carrier concentration, $l$=length) at least twice the critical value for oscillations is provided with a p contact at a distance $d$ from the anode. The distance $d$ is such that $n_0d$ is less than the critical value for oscillations. When a sufficient reverse bias is applied at the p contact, a depletion region of lower carrier concentration is established. This requires only a low power input, and results in the domain nucleation and propagation process and oscillations being interrupted by, in effect, trapping a high field in the space between the p contact and the anode. The field condition is stable and the field in the remainder of the body remains below threshold. Oscillations may be started again merely by removing the reverse bias signal.

OBJECTS OF THE INVENTION

Therefore, it is an object of the invention to provide a new and improved controllable high frequency oscillator.

It is a further object to provide an oscillator of this type in which the control is produced quickly and reliably by a low power input signal.

A further object is to provide an improved Gunn oscillator in which the oscillations can be started or stopped quickly under the control of low power control signals.

It is a further object of the invention to provide a novel structure for a Gunn oscillator element of the type in which the $n_0l$ product is at least twice the critical value, and which includes means for establishing a depletion region within a critical distance $d$ from the anode such that the product of $n_0d$ is less than the critical value for the oscillations.

These and other objects, features and advantages of the invention will be apparent from the following more particular description of preferred embodiments of the invention as illustrated in the accompanying drawings.

DESCRIPTION OF PREFERRED EMBODIMENT

Figure 1:
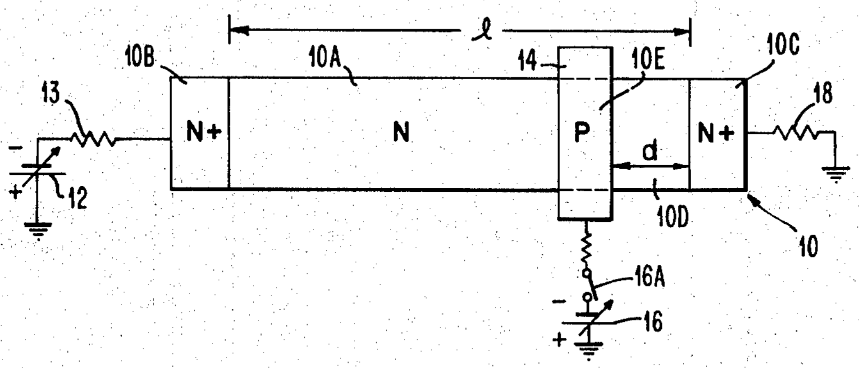
FIG. 1 is a somewhat schematic representation of one embodiment of the present invention.

FIG. 1 is a somewhat schematic representation of a Gunn effect oscillator together with the circuitry necessary to modulate the oscillations in accordance with the principles of the present invention. The circuit includes an active device generally designated 10 which is formed of a body of gallium arsenide having a central portion 10A and two ohmic connections 10B and 10C. A voltage source, represented by a battery 12 and resistor 13, applies a voltage across the device 10 in a polarity such that ohmic connection 10B is the cathode and ohmic connection 10C is the anode for the device. The control input for the device is provided by a p contact 14 which is connected to the device at a region 10E. Since the main body 10A of the device is n type, a junction is formed between p type contact 14 and region 10E. A signal source represented by a battery 16 and resistor is connected to p contact 14 to supply the control signals for the device. The region 10E to which the p contact is connected is at a distance $d$ from the anode contact. This distance is critical to the operation of the device.

The basic oscillator circuit with the exception of the p contact located within the critical distance of the anode is conventional. When a voltage is supplied by the voltage source 12 above a threshold value of voltage for the gallium arsenide body, a high field domain is nucleated near the cathode 10B and then propagates through the gallium arsenide to the anode 10C where it is extinguished. This domain is produced as a result of an intervalley transfer of electrons from a low energy valley in which the electrons have high mobility to a high energy valley in which the electrons have a low mobility. The domain nucleation, propagation and extinction process continues repetitively to produce high frequency oscillations in the device and a load which is generally represented at 18. The device thus described is a normal Gunn effect oscillator operated in a domain propagation mode. When the device is below threshold, the field in the bulk is uniformly distributed. When a domain is nucleated near the cathode, there is a high electric field associated with the domain, and the electric field in the remainder of the device is lowered below threshold. As the high field domain propagates from cathode to anode, this condition persists in that there is a high field in the region of the domain and in the remainder of the device the field is at a lower value which is below threshold.

It is, of course, well known that it is necessary in order to produce such high frequency oscillations in a body of gallium arsenide, or other Gunn effect type material, that the $n_0l$ product for the device must be above a certain critical value ($n_0$ represents the concentration of the majority carriers, and $l$ represents the length of the device between the anode and the cathode). Typically in gallium arsenide this value is about $10^{12}$ cm.$^{-2}$, but may vary somewhat from sample to sample. In the device of FIG. 1 the design is such that the $n_0l$ product is at least twice the minimum critical value for domain nucleation and propagation.

The control signal source 16 connected to the p contact 14 is selectively energized to interrupt the oscillations which occur in the device 10 when the voltage applied across the ohmic contact is above threshold. Source 16 supplying a negative, or reverse bias, potential to p contact 14 under the control of a switch schematically represented as 16A. When this switch is operated the junction between p contact 14 and region 10E is reverse biased and a depletion region is produced in the vicinity of the junction which extends into the n type gallium arsenide body. This depletion region produced in region 10E beneath p type contact 14 reduces the excess carrier concentration in this region below the value of carrier concentration $n_0$ for the rest of the device. This is indicated graphically in the plot of FIG. 1B. With the carrier concentration reduced in this region, the resistivity of the region is higher than the resistivity of the remaining portion of the gallium arsenide body.

Figure 1A:
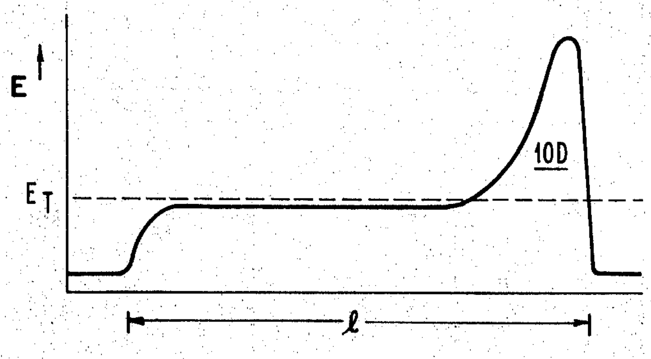
FIG. 1A is a plot indicating the field distribution in the semiconductor body in the embodiment of FIG. 1 when a high field is trapped near the anode.
Figure 1B:
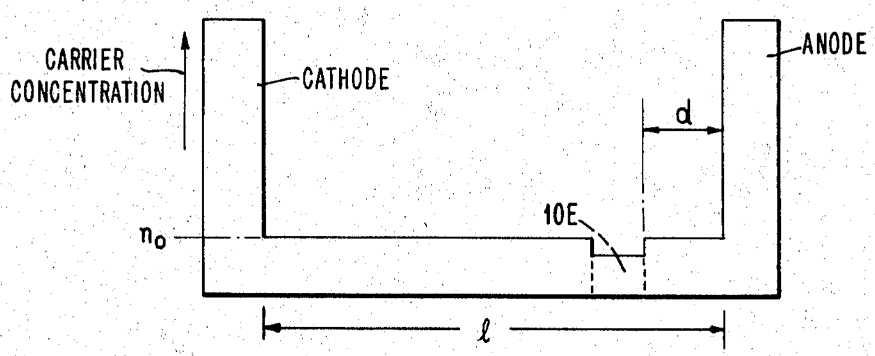
FIG. 1B is a plot illustrating the region of the depleted carrier concentration which is established in the semiconductor body of FIG. 1 when a reverse bias is applied to the p contact on the semiconductor body.

It has been found that when a sufficient reverse bias is applied to the p type contact 14 in the manner shown, and this contact is located within a critical distance $d$ of the anode, the oscillations in the gallium arsenide device 10 are interrupted and a high field is in effect trapped in the portion of the gallium arsenide body extending from the anode to region 10E. This field distribution which is stable, is shown in FIG. 1A. As is shown, when the high field is trapped next to the anode the field in the rest of the body remains below the threshold field $E_T$.

In order for this to occur, it is necessary that the distance $d$ be sufficiently small that in the region 10D, which extends from the p contact region 10E to the anode, the body in effect has a carrier concentration times length product which is less than the critical value for bulk oscillations. More specifically in the present case, the product $n_0d$ is less than the critical value of about $10^{12}$ cm.$^{-2}$ for gallium arsenide. Since the carrier concentration $n_0$ is uniform throughout the device as it is prepared, the distance $d$ must be sufficiently small depending on the concentration to meet the above requirement. Thus, assuming a device in which the $n_0l$ product of the device as prepared is three times the minimum value, then the p type contact 14 must be positioned so that the region 10D extending from contact 14 to the anode is less than ⅓ the overall length $l$ of the gallium arsenide body.

In order for the above-described interruption of the oscillations and the accompanying stable high field region near the anode to be produced, the negative bias applied by source 16 must produce a small but significant change in the carrier concentration in region 10E. Though the depletion may be as small as a 5% depletion, or less, in some cases, it is preferred that the bias when initially applied diminishes the carrier concentration by about 10% or more.

It is important to note that the reverse bias in this mode of operation must be sufficiently great that it maintains the juncion between contact 14 and region 10E reverse biased regardless of the position of the high field in the device. As stated above, when a domain is nucleated at the cathode and a high field region is then produced, the main voltage drop across the device 10 is in the region of the domain and, therefore, region 10E has a voltage value which is very close to the voltage value of the anode. In such a case only a small reverse bias negative potential is necessary to reverse bias the junction between contact 14 and region 10E. However, as the domain propagates from left to right through the region 10E and is trapped in region 10D, the main voltage drop across the device is now in the region 10D and, therefore, the voltage at region 10E is much less positive than is the case when the domain is on the other side of this region. This being the case, a greater negative potential is necessary for p type contact 14 to maintain the junction reverse biased when the high field is trapped in region 10D as is indicated in FIG. 1A.

Since it is only necessary to produce sufficient power to reverse bias this junction and produce the desired depletion region within the critical distance of the anode, the power requirements for the control signal are not at all severe. The oscillations in the basic oscillator circuit can be controlled by very small input or control signals. When switch 16A is opened to remove the reverse bias, the high field in region 10D decays. The oscillatory mode produced by domain nucleation, propagation and extinction is immediately re-established, and a high frequency output is produced across load 18.

Figure 2:
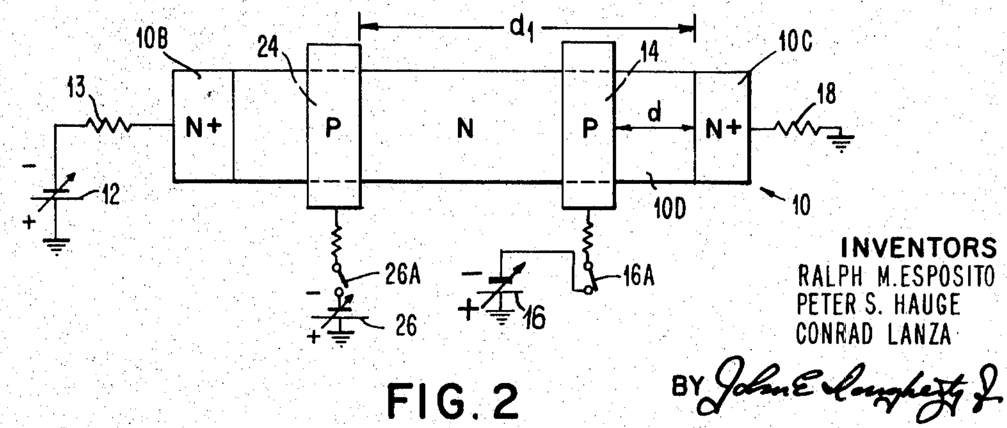
FIG. 2 is a schematic showing of a second embodiment of the present invention.

In the embodiment of FIG. 1 the simplest and most conventional form of Gunn oscillator is shown to be controlled by the depletion region established within the critical distance of the anode. The same type of control may be used with other types of devices. In order to illustrate this, one such embodiment is shown in FIG. 2. In this embodiment the device is exactly the same as is shown in FIG. 1 except that a second p contact 24 has been added between the cathode 10B and the p type contact 14. The purpose of the p contact 24 and a biasing supply 26 operated under the control of a switch 26A is to control the point at which domains are nucleated within the gallium arsenide body. When switch 26A is closed to reverse bias the junction between p contact 24 and the body, a depletion region of high resistivity is produced and this region may even have a higher resistivity than that which is produced by reverse biasing contact 14. The purpose of the high resistivity region established by reverse biasing contact 24 is to cause the domain nucleation to occur at this contact rather than at the cathode and thereby increase the output frequency for the device by lessening the distance over which each domain propagates. It should, of course, be noted that the distance $d_1$ from contact 24 to anode 10C must be sufficiently large that in this section of the body the product $n_0d_1$ is greater than the critical value necessary for oscillations. When operated in this mode with the domains nucleated beneath contact 24, the oscillations can be controlled in the same manner as in the device of FIG. 1 by applying an appropriate reverse biasing potential to contact 14.

In the operations described above, it is assumed that the domain is nucleated and is in the process of being propagated, when the control signal to interrupt oscillations is applied at contact 14. However this signal does not have a precise time requirement. It may be applied before the oscillations are started so that the stable high field in region 10D is produced immediately when the supply voltage across the ohmic contacts exceeds the threshold value. Further, it is also possible, according to the timing relationship, that the interruption in oscillations may be produced after a domain has completely propagated to the anode. The high field is then stably established in region 10D without the nucleation of another domain either at the cathode in the embodiment of FIG. 1 or beneath the p contact 24 in the embodiment of FIG. 2. In the latter case, the operation can be controlled so that the domain does normally nucleate beneath contact 24 by controlling the size of the reverse biases applied and, therefore, the relative resistivity of the regions beneath p contacts 14 and 24.

Typical parameters for the device 10 in the preferred embodiment of FIG. 1 are as follows: the carrier concentration in very pure material can be about $10^{14}$ carriers per cm.$^3$ ($n_o=10^{14}$ carriers per cm.$^3$). The overall length $l$ of the body is about 12 mils, and $d$ is about 3 mils. For this specific device the $n_ol$ product is about three times the critical value. This type of device is illustrative of the preferred embodiment since the fabrication difficulties increase as the device is made smaller. For ease of fabrication it is desirable to use material having a relatively low excess carrier concentration $n_o$. This allows the distance $d$ to be larger and still be within the critical requirements, thereby minimizing the difficulties of attaching the p type contact 14.

In the preferred embodiments shown in FIGS. 1 and 2 above the oscillator is operated in the more conventional domain propagation mode where the domain is nucleated at or near the cathode and is extinguished at the anode. The principles of the present invention may be also applied to oscillators operating in other modes such as the quenched domain mode, or LSA mode.

The effect which is produced by the application of the reverse bias to the control contact is then determined by whether or not the domain is allowed to propagate to that contact before it is quenched. It is, of course, possible to couple the output circuit for the oscillations through either delay or through reactive elements to the contact 14 to obtain a feedback type of control for establishing the carrier depletion in the region 10E which is effective to interrupt the oscillations and cause the stable condition with the high field in region 10D to be established. Further, it may be also possible to control the amplitude of the reverse bias so that as the domain propagates through the reverse biased control region, the reverse bias is reduced sufficiently by the change in voltage in this region, or even changed to a slight forward bias. According to the relative bias values of such a case, it is possible to obtain a wider range of frequency modulation, not restricted to the on-off type operation described.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a semiconductor bulk oscillator of the type including a body of n type semiconductor material having anode and cathode contacts and voltage means for applying a sufficient voltage between said contacts to produce inherent bulk high frequency oscillations due to domains which are propagated in the body from cathode to anode, and in which the product of the excess majority carrier concentration and length of the body between the contacts ($n_ol$) is larger than the critical value for the production of said inherent high frequency oscillations, the improvement comprising:

(a) first means for establishing a first region in said body in which the majority carrier concentration is less than the concentration ($n_o$) in the remainder of said body;

(b) said region being located in said body at a distance $d$ from the anode such that the product $n_od$ is less than the critical value for the production of inherent high frequency oscillations.

2. The oscillator of claim 1 wherein said first means comprises a p contact and a p–n junction between the contact and said first region, and means for selectivity applying a reverse bias potential across said junction.

3. The oscillator of claim 2 wherein when said reverse bias is applied said bulk oscillations are interrupted due to the trapping of a high stable electric field between said first region and said anode, said high field lowering the voltage in said first region to a value less positive than the voltage in the region when a domain is propagating between said cathode and said first region, and said reverse bias potential being sufficient to maintain said junction reverse biased when said high field is trapped between said first region and said anode.

4. The oscillator of claim 1 wherein the majority carrier concentration established in said first region is at least 10% less than the carrier concentration ($n_o$) in the body.

5. The oscillator of claim 1 wherein said body is gallium arsenide, said $n_ol$ product is in excess of the critical value for oscillations by a factor greater than 2.

6. The oscillator of claim 1 including further means located between said first region and said cathode for producing a high resistance region at which domains are nucleated in said body.

7. An oscillator circuit comprising:

(a) a body of one conductivity type semiconductor material having an anode contact and a cathode contact and means for applying a voltage above the threshold necessary to produce high frequency oscillations in said body;

(b) the $n_ol$ product for said body being more than the minimum value necessary for the production of inherent bulk oscillations;

(c) an opposite conductivity type contact made to said body at a distance $d$ from the anode such that the product $n_od$ is less than the critical value for bulk oscillations; and (d) means for applying biasing signals to said opposite conductivity type contact.

8. The oscillator circuit of claim 7 wherein said body is n type gallium arsenide and said critical value for the $n_ol$ product is about $10^{12}$ cm.$^{-2}$.

9. The oscillator circuit of claim 7 wherein said body of semiconductor material is n type and said contact is p type.

10. The oscillator circuit of claim 9 in which said means for applying biasing signals is controllable to apply a reverse bias to said p contact to control the oscillations in said oscillator.

11. The oscillator circuit of claim 10 in which said reverse bias signal is sufficiently large to interrupt said oscillations and cause a field distribution to be established stably in said body with a high field trapped between said p type contact and said anode.

12. The oscillator circuit of claim 11 wherein said reverse bias applied to said p type contact is sufficient to reverse bias said contact even when said field or high field is trapped between said contact and said anode.

13. The oscillator circuit of claim 12 wherein said $n_0l$ product for the device is about three times the critical value for oscillations.

References Cited

UNITED STATES PATENTS

| | | | |
|---|---|---|---|
| 3,452,222 | 6/1969 | Shoji | 331—107GX |

FOREIGN PATENTS

| | | | |
|---|---|---|---|
| 1,120,509 | 7/1968 | Great Britain | 331—107G |
| 1,498,778 | 9/1967 | France | 331—107G |

OTHER REFERENCES

Hayashi, "Three-Terminal GaAs Switches", IEEE Transactions On Electron Devices, vol. ED-15, No. 2, February 1968, pp. 105-110.

ROY LAKE, Primary Examiner

S. H. GRIMM, Assistant Examiner

U.S. Cl. X.R.

317—235; 331—173